United States Patent
Fujii

(10) Patent No.: US 10,692,738 B2
(45) Date of Patent: Jun. 23, 2020

(54) INFORMATION MANAGEMENT DEVICE AND INFORMATION MANAGEMENT METHOD

(71) Applicant: FUJI CORPORATION, Chiryu-shi (JP)

(72) Inventor: Kimio Fujii, Okazaki (JP)

(73) Assignee: FUJI CORPORATION, Chiryu-shi (JP)

( * ) Notice: Subject to any disclaimer, the term of this patent is extended or adjusted under 35 U.S.C. 154(b) by 374 days.

(21) Appl. No.: 15/562,025

(22) PCT Filed: Mar. 30, 2015

(86) PCT No.: PCT/JP2015/059898
§ 371 (c)(1),
(2) Date: Sep. 27, 2017

(87) PCT Pub. No.: WO2016/157356
PCT Pub. Date: Oct. 6, 2016

(65) Prior Publication Data
US 2018/0108541 A1    Apr. 19, 2018

(51) Int. Cl.
*H01L 21/52* (2006.01)
*H01L 21/67* (2006.01)
(Continued)

(52) U.S. Cl.
CPC .......... *H01L 21/52* (2013.01); *G01R 31/2831* (2013.01); *G01R 31/2867* (2013.01);
(Continued)

(58) Field of Classification Search
CPC ....... H01L 21/00; H01L 2221/00; G05B 1/00; G05B 2219/00; G06K 1/00; G06K 2207/00
See application file for complete search history.

(56) References Cited

U.S. PATENT DOCUMENTS

| | | | |
|---|---|---|---|
| 9,648,795 B2 * | 5/2017 | Gustafsson | ....... H01L 21/67132 |
| 2002/0121915 A1 | 9/2002 | Alonso Montull et al. | |

(Continued)

FOREIGN PATENT DOCUMENTS

| | | | |
|---|---|---|---|
| JP | 2006-165127 A | 6/2006 | |
| JP | 2007-194253 A | 8/2007 | |

(Continued)

OTHER PUBLICATIONS

Extended European Search Report dated Mar. 6, 2018 in European Patent Application No. 15887509.6, citing documents AA through AC and AO through AR therein, 6 pages.

(Continued)

*Primary Examiner* — Jermele M Hollington
*Assistant Examiner* — Temilade S Rhodes-Vivour
(74) *Attorney, Agent, or Firm* — Oblon, McClelland, Maier & Neustadt, L.L.P.

(57) ABSTRACT

A management device that, when a component is mounted on a substrate, acquires pickup source information that includes pickup position information of the mounted component and mounting destination information that includes mounting position information of the mounted component and memorizes mounting result information that links both the above information on an HDD. By referencing the mounting result information memorized on the HDD and obtaining the pickup source information from the mounting destination information of the mounted component, it is possible to identify the pickup position at the wafer from which the mounted component was picked up.

7 Claims, 15 Drawing Sheets

(51) Int. Cl.
- *G01R 31/28* (2006.01)
- *H01L 21/66* (2006.01)
- *H05K 13/04* (2006.01)
- *H05K 13/08* (2006.01)
- *H01L 21/677* (2006.01)

(52) U.S. Cl.
CPC ...... *H01L 21/677* (2013.01); *H01L 21/67144* (2013.01); *H01L 21/67276* (2013.01); *H01L 21/67288* (2013.01); *H01L 22/20* (2013.01); *H05K 13/043* (2013.01); *H05K 13/083* (2018.08)

(56) References Cited

U.S. PATENT DOCUMENTS

| | | | |
|---|---|---|---|
| 2003/0158679 A1 | 8/2003 | Fukushima | |
| 2003/0202703 A1 | 10/2003 | Ogi | |
| 2007/0064233 A1* | 3/2007 | Takagi | G03F 9/7049 356/401 |
| 2009/0268959 A1* | 10/2009 | Harada | G06T 7/001 382/149 |
| 2010/0034621 A1* | 2/2010 | Martin | H01L 21/67265 414/217.1 |
| 2012/0228669 A1* | 9/2012 | Bower | H01L 27/3255 257/103 |
| 2014/0017822 A1* | 1/2014 | Sakai | H01L 22/10 438/15 |
| 2015/0176139 A1* | 6/2015 | Okamoto | H01L 21/6708 156/345.17 |

FOREIGN PATENT DOCUMENTS

| | | |
|---|---|---|
| JP | 2012-186260 A | 9/2012 |
| JP | 2012-222054 A | 11/2012 |
| JP | 2013-26537 A | 2/2013 |
| JP | 2014-120654 A | 6/2014 |
| WO | 2013/108368 A1 | 7/2013 |
| WO | WO 2015/004733 A1 | 1/2015 |

OTHER PUBLICATIONS

International Search Report dated Jun. 23, 2015 in PCT/JP2015/059898 filed Mar. 30, 2015.

* cited by examiner (a) Nearby pickup position (b) Nearby die information

|  | Pickup position | Mounting destination information ||
|---|---|---|---|
|  |  | Substrate ID | Mounting position |
| Defect die | (Xi, Yj) | B-015 | C-0017 |
| Nearby die | (X(i-1), Y(j-1)) | B-011 | C-0017 |
|  | (Xi, Y(j-1)) | B-011 | C-0031 |
|  | (X(i+1), Y(j-1)) | B-011 | C-0047 |
|  | (X(i-1), Yj) | B-014 | C-0047 |
|  | (X(i+1), Yj) | B-015 | C-0031 |
|  | (X(i-1), Y(j+1)) | B-*** | D-**** |
|  | (Xi, Y(j+1)) | B-*** | D-**** |
|  | (X(i+1), Y(j+1)) | B-*** | D-**** |

(a) Defect statistical information (b) Defect position trend map

INFORMATION MANAGEMENT DEVICE AND INFORMATION MANAGEMENT METHOD

TECHNICAL FIELD

The present disclosure relates to an information management device and an information management method.

BACKGROUND ART

There are well known mounting systems that memorize information related to mounting processing of mounting supplied components onto a substrate. For example, the mounting system of patent literature 1 transfers multiple components supplied from a component supply section to a specified pickup position by picking the components up using one of multiple pickup nozzles, then picks up the components transferred to the pickup position using one of multiple mounting heads, and mounts the components on a substrate. This mounting system memorizes information of which pickup nozzle was used to transfer a component to the pickup position, and information of which mounting head was used to mount the component, with this information being linked to each corresponding component. By this, it is possible to identify the movement path of each component from supply to mounting on the substrate.

CITATION LIST

Patent Literature

Patent Literature 1: JP-A-2012-186260

SUMMARY

However, with such a mounting system, there are cases in which wafers for which multiple components (such as dies) can be picked up. During inspection of a substrate mounted such components in such a case, if a defect is discovered with a component, one should be able to see a pattern in the pickup position or the like at the wafer from which the component was picked up. If an operator is to investigate such a trend, it is not sufficient for the mounting system simply to manage information for identifying a movement path of a component from supply to mounting on the substrate.

An object of the present disclosure is to more appropriately manage information when mounting multiple components supplied from a wafer onto a substrate.

The present disclosure uses the following means to achieve the above object.

An information management device of the present disclosure is for managing information related to mounting at a mounting system for picking up a component from a wafer on which multiple components are diced and mounting the component on a substrate, the information management system including: a pickup source information acquiring means configured to acquire pickup source information including pickup position information related to a pickup position of the component at the wafer;
a mounting destination information acquiring means configured to acquire mounting destination information including mounting position information related to a mounting position of the component on the substrate; and
a memorizing means configured to, when the component is mounted on the substrate, memorize mounting result information that links the pickup source information of the mounted component and the mounting destination information of the mounted component.

An information management device of the present disclosure, when a component is mounted on a substrate, memorizes mounting result information that links pickup source information that includes pickup position information of the mounted component and mounting destination information that includes mounting position information of the mounted component. Accordingly, by referencing the mounting result information and obtaining the pickup source information from the mounting destination information of the mounted component, it is possible to identify the pickup position at the wafer from which the mounted component was picked up. Therefore, for example, in a case in which a defect occurs for a mounted component in the mounting result information, because information useful for investigating whether there is a relationship between the pickup position and the defect is obtained, it is possible to perform information management more appropriately.

Also, an information management device of the present disclosure may be configured such that the pickup source information includes identification information for identifying the wafer, the mounting destination information includes identification for identifying the substrate, and the information management device further includes a defect result information acquiring means configured to acquire defect result information including, in a case in which an inspection result of the substrate on which the component was mounted is received and a defect result is determined indicating that a defect has occurred for the component mounted on the substrate, identification information of the defect substrate with the defect, and a pickup source information identifying means configured to, based on the identification information of the defect substrate and the mounting position information of the defect component, and referring to the mounting result information, identify identification information of the pickup source wafer from which the component was picked up and pickup position information of the defect component at the pickup source wafer. Accordingly, because it is possible to identify a pickup source wafer from which a defect component was picked up and pickup position information of the defect component at the pickup source wafer, it is possible to obtain useful information for analysis of defect causes from the mounting result information.

Also, an information management device of the present disclosure may include a nearby component information output means configured to, based on the identification information of the pickup source wafer and the pickup position information of the defect component, and referring to the mounting result information, select a nearby pickup position of a specified range nearby to the pickup position of the defect component at the pickup source wafer, identify the identification information of the substrate on which the nearby component picked up from the nearby pickup position were mounted, and the mounting position information of the nearby component on the substrate, and output these as nearby component information. Accordingly, because it is possible to identify a mounting position and a substrate on which nearby components were mounted, it is possible to perform a follow-up investigation of the mounting position of nearby components.

Also, an information management device of the present disclosure may include a statistical information output means configured to, based on the identification information of the pickup source wafer and the pickup position information of the defect component, create and output statistical information relating to the occurrence of the defect component for each pickup position of each component, for a same type of wafer from which the same type of component is picked up. Accordingly, it is possible to understand trends in pickup positions of components for which defects occur, and to investigate defect causes and perform countermeasures.

Also, an information management device of the present disclosure may include an instruction information output means configured to, based on the statistical information, identify pickup positions with a high occurrence rate of the defect components from among the pickup positions of each component on the same type of wafer, and output instruction information instructing a mounting device of a mounting system to not pick up the component from the identified pickup positions. Accordingly, in a case in which a given trend can be seen in pickup positions of defect components, because it is possible to pick up components while missing out those pickup positions, the occurrence of defect components (defect substrates) can be curtailed.

An information management method of the present disclosure is a method for managing information related to mounting at a mounting system for picking up a component from a wafer on which multiple components are diced and mounting the component on a substrate, the information management method including:
(a) a step for acquiring pickup source information including pickup position information related to a pickup position of the component at the wafer;
(b) a step for acquiring mounting destination information including mounting position information related to a mounting position of the component on the substrate; and
(c) a step for memorizing, when the component is mounted on the substrate, mounting result information that links the pickup source information of the mounted component and the mounting destination information of the mounted component.

With an information management method of the present disclosure, when a component is mounted on a substrate, mounting result information that links pickup source information that includes pickup position information of the mounted component and mounting destination information that includes mounting position information of the mounted component is memorized. Accordingly, similar to with the above information management device, by referencing the mounting result information and obtaining the pickup source information from the mounting destination information of the mounted component, it is possible to identify the pickup position at the wafer from which the mounted component was picked up. Therefore, for example, in a case in which a defect occurs for a mounted component in the mounting result information, because information useful for investigating whether there is a relationship between the pickup position and the defect is obtained, it is possible to perform information management more appropriately.

DESCRIPTION OF EMBODIMENTS

Figure 1:
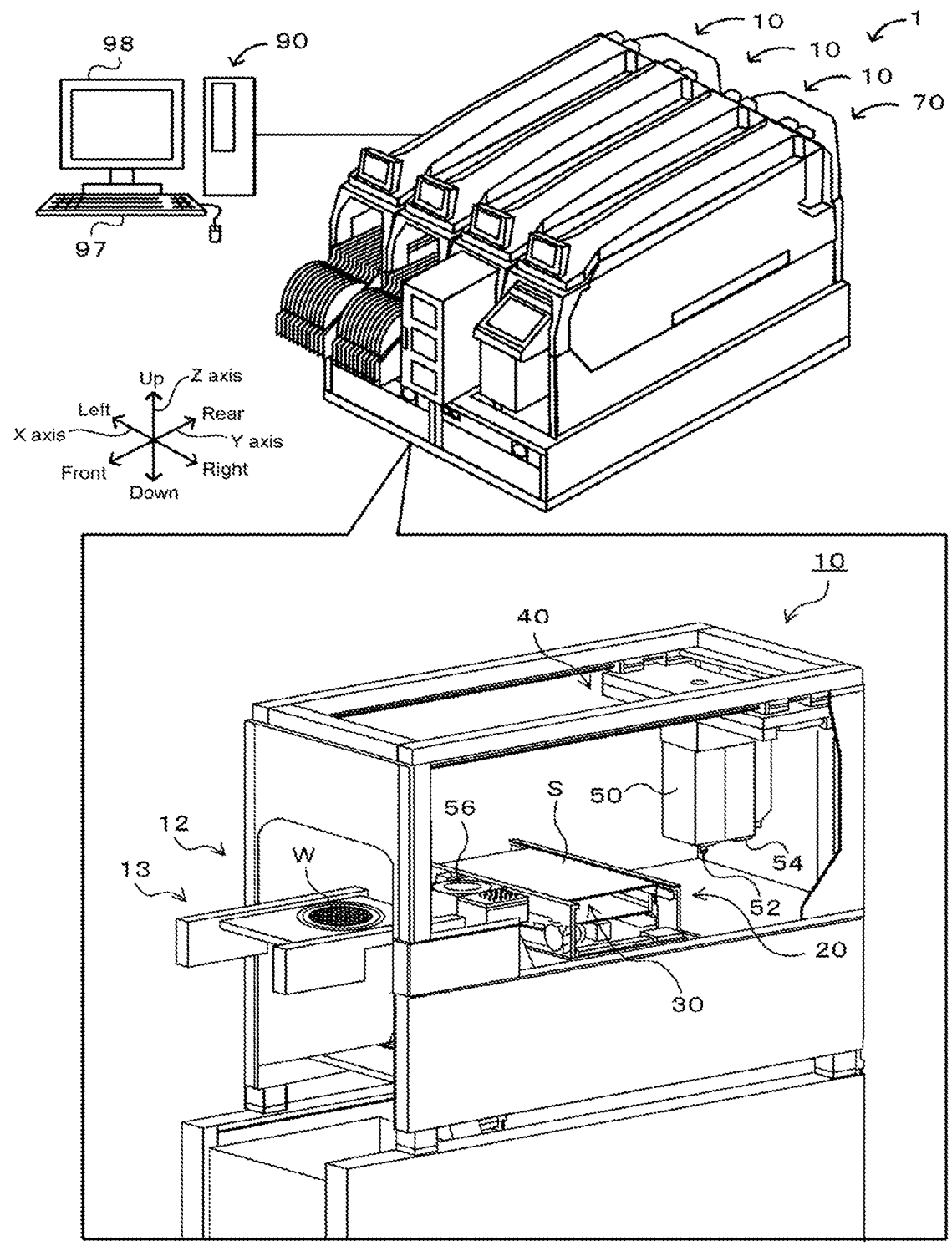
FIG. 1 shows the overall configuration of mounting system 1.
Figure 2:
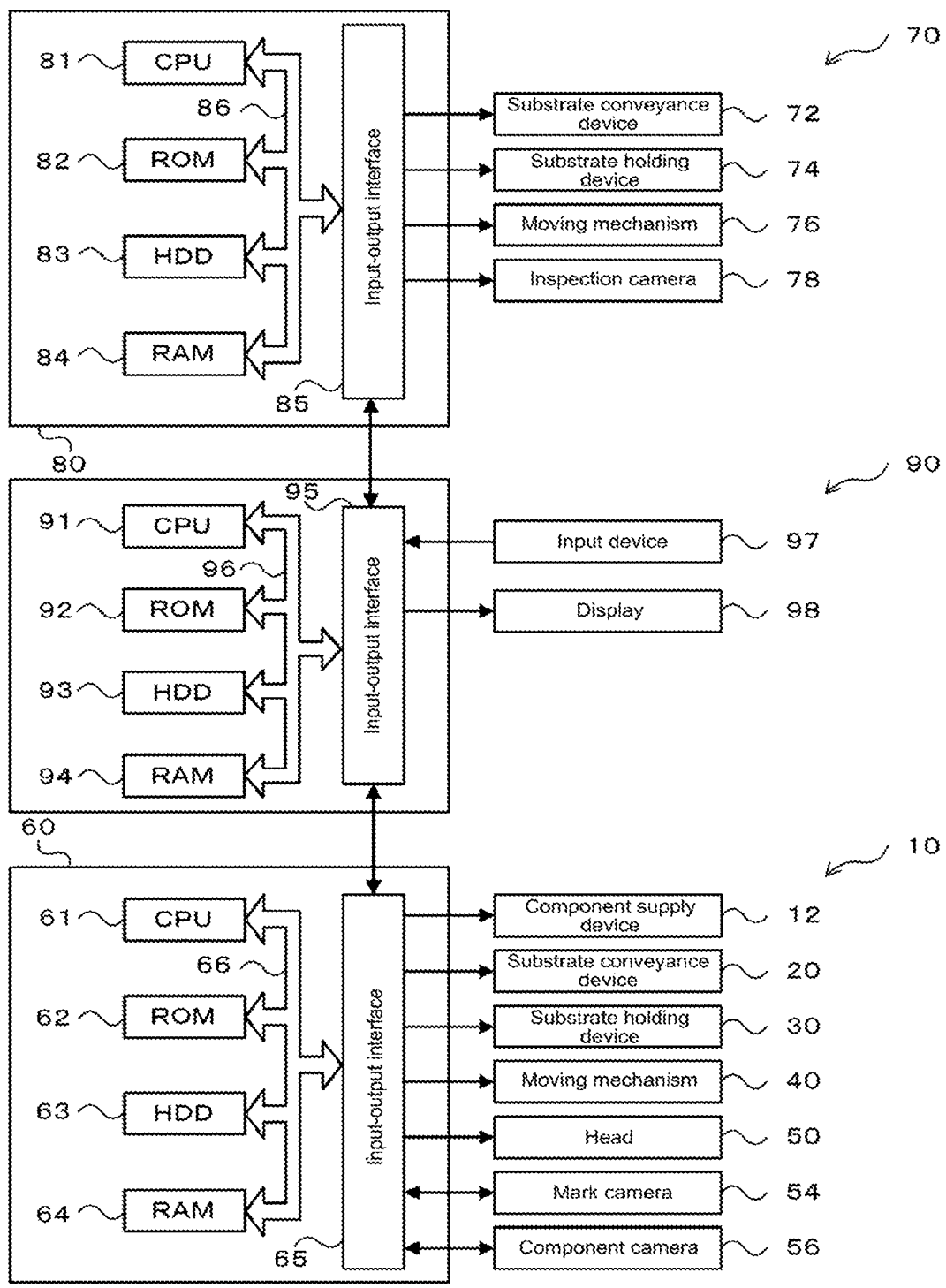
FIG. 2 is a block diagram showing the electrical connections of mounting system 1.

Embodiments of the present disclosure are described below. FIG. 1 shows the overall configuration of mounting system 1 and FIG. 2 shows electrical connections of mounting system 1. Note that, for the present embodiment, the left/right direction in FIG. 1 is the X-axis direction, the front/rear direction is the Y-axis direction, and the up/down direction is the Z-axis direction. Mounting system 1 is provided with multiple mounting devices 10 that mount components on substrate S, inspection device 70 that is provided downstream of mounting devices 10 and inspects a mounting condition of a component, and information management device 90 that performs management of various types of information related to mounting processing and inspection processing. Mounting device 10 is provided with, as a component supply device that supplies components, a device that supplies components from a tape reel that stores components, and a device that supplies components (dies D) from a wafer pallet on which wafer W is loaded, the latter of which is described below in this embodiment.

As shown in FIG. 1, mounting device 10 is provided with component supply device 12 that supplies dies D from wafer pallet 13 on which is loaded wafer W that has multiple diced components (dies D), substrate conveyance device 20 that conveys tabular substrate S, substrate holding device 30 that holds conveyed substrate S, head 50 that uses suction nozzle 52 to pick up die D supplied from component supply device 12 via suction pickup and mount the die D on the substrate S, moving mechanism 40 that moves head 50 in XY directions, mark camera 54 capable of imaging ID marks indicating a substrate ID affixed to a specified position of substrate S and ID marks indicating a wafer ID affixed to a specified position of wafer pallet 13, component camera 56 capable of imaging a die D picked up by a suction nozzle 52 from below, and mounting control device 60 (refer to FIG. 2) that performs overall control of mounting device 10.

Figure 3:
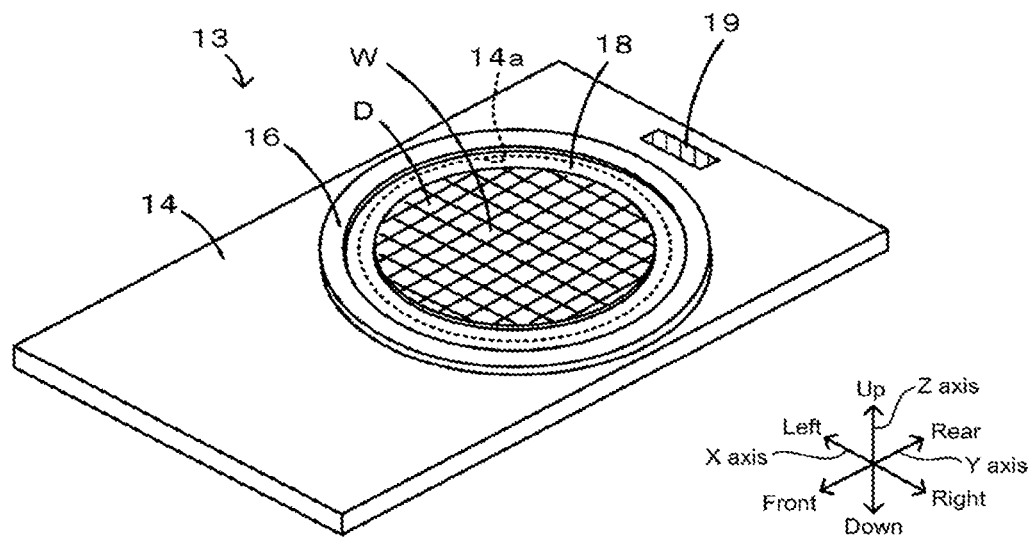
FIG. 3 is a perspective view of wafer pallet 13.

As shown in FIG. 3, wafer pallet 13 is provided with rectangular pallet main body 14 in which there is circular hole 14a, and adhesive sheet 18 that is capable of expanding and contracting and that is fixed to pallet main body 14 via grip ring 16 in an expanded state covering circular hole 14a. Wafer W on which are formed many rectangular dies D is attached to an upper surface of adhesive sheet 18. Dies D are formed by wafer W being diced after pattern printing that forms circuits on the dies D has been performed. Also, ID mark 19 representing a wafer ID is affixed to an upper surface of wafer pallet 13. The wafer ID indicates the type of wafer W, manufacturing number, and so on. Pusher pins, not shown, are arranged below adhesive sheet 18. The pusher pins, when a die D is picked up by suction nozzle 52, push the die D up from below adhesive sheet 18 to make the die D easier to peel from adhesive sheet 18.

Figure 4:
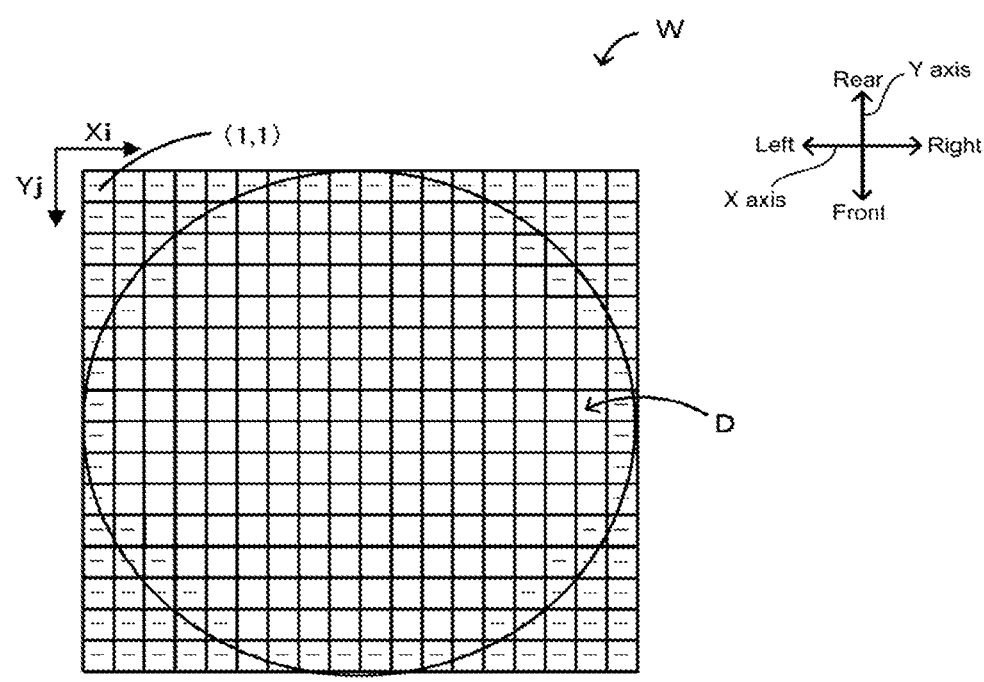
FIG. 4 illustrates pickup positions of dies D at wafer W.

FIG. 4 illustrates pickup positions of dies D picked up from wafer W. As shown, a pickup position of die D, for example, is represented by pickup position coordinates (X, Y) based on an XY coordinate system in which the coordinate interval is decided based on the size of the dies D and a reference position (1, 1) in the top left corner. Note that, the "-" sign in the figure represents positions not on wafer W or positions at the edge of wafer W where the shape of dies D may be improper, and thus dies D that are not to be picked up. Head 50 (suction nozzle 52), for example, picks up dies D in order from left to right as shown in FIG. 4, and after completing pickup of one line of dies D, moves to the next row down and repeats pickup processing.

As shown in FIG. 2, mounting control device 60 is configured from a microprocessor that is based around CPU 61, and is also provided with ROM 62, HDD 63, RAM 64, and input-output interface 65. These items are electrically connected by bus 66. Image signals from mark camera 54, image signals from component camera 56, and so on are inputted into mounting control device 60 via input-output interface 65. On the other hand, mounting control device 60 outputs drive signals to component supply device 12, drive signals to substrate conveyance device 20, drive signals to substrate holding device 30, drive signals to moving mechanism 40, drive signals to head 50, and so on, via input-output interface 65. Also, mounting control device 60 is connected to management device 90 via a communication network such that two-way communication is possible, and communication of data and control signals is performed between these items. And, with mounting control device 60, a pickup position coordinate map of dies D based on the type of wafer W (size of wafer W and size of diced dies S) is memorized on HDD 63, and when a wafer W is supplied, the pickup position coordinate map is read in accordance with the type of wafer W. Note that, the pickup position coordinate map is memorized based on input from an operator.

As shown in FIG. 2, inspection device 70 is provided with substrate conveyance device 72 that conveys substrate S on which components such as dies D have been mounted, substrate holding device 74 that holds conveyed board S, inspection camera 78 that captures inspection images for inspecting mounted components such as dies D, moving mechanism 76 for moving inspection camera 78 in XY directions, and inspection control device 80 that performs overall control of inspection device 70. Substrate conveyance device 72, substrate holding device 74, and moving mechanism 76 are each configured similar to substrate conveyance device 20, substrate holding device 30, and moving mechanism 40 of mounting device 60.

Inspection control device 80 is configured similar to mounting control device 60, and is provided with CPU 81, ROM 82, HDD 83, RAM 84, and input-output interface 85. These items are electrically connected by bus 86. Image signals and so on from inspection camera 78 are inputted to inspection control device 80 via input-output interface 85. On the other hand, inspection control device 80 outputs drive signals to moving mechanism 76, imaging signals to inspection camera 78, and so on, via input-output interface 85. Also, inspection control device 80 is connected to management device 90 via a communication network such that two-way communication is possible, and communication of data and control signals is performed between these items.

Management device 90, for example, is a general purpose computer provided with items such as CPU 91, ROM 92, HDD 93, RAM 94, and input-output interface 95. These items are electrically connected by bus 96. Management device 90 receives input signals from input device 97 such as a mouse or keyboard via input-output interface 95. Also, management device 90 outputs an image signal to display 98 via input-output interface 95. HDD 93 memorizes a production plan of substrate S. A production plan of substrate S is a plan that defines items such as which components (dies D) are to be mounted at which positions on a mounting surface of substrate S and in what order by mounting device 10, and how many of those substrates S mounted with components are to be manufactured. Also, a production plan includes information of substrate S, information of wafer W, and mounting position information of components (dies D), and so on. These are acquired via input by an operator. Further, management device 90 outputs command signals to mounting control device 60 such that components are mounted according to the production plan, and outputs command signals to inspection control device 80 such that the substrate mounted with components is inspected.

Figure 5:
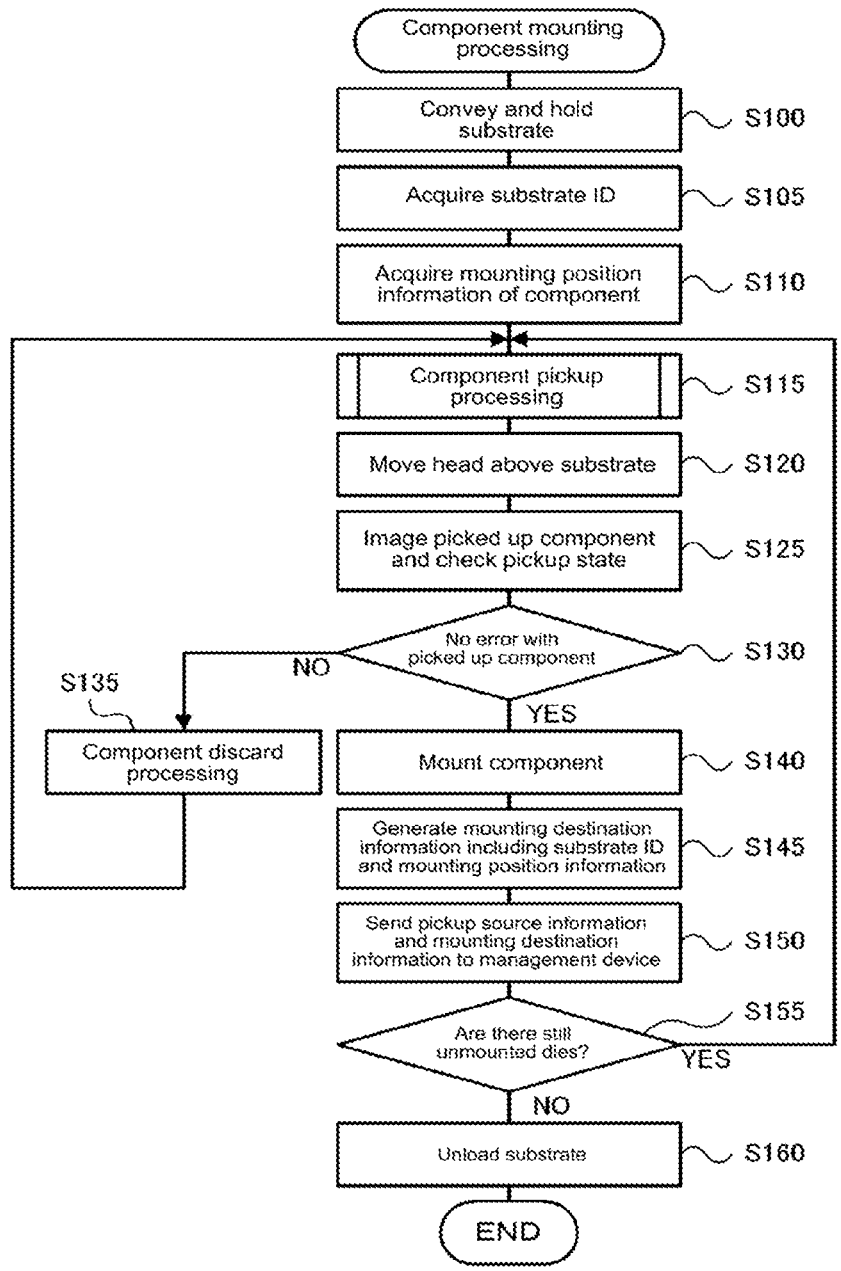
FIG. 5 is a flowchart showing an example of component mounting processing.

Operation of mounting system 1 is described below. First, component mounting processing of mounting components (dies D) on substrate S by mounting device 10 is described. FIG. 5 is a flowchart showing an example of component mounting processing performed by CPU 61 of mounting control device 60. In this component mounting processing, CPU 61, first, after controlling substrate conveyance device 20 such that substrate S is conveyed above substrate holding device 30, controls substrate holding device 30 to hold substrate S (S100). Next, CPU 61 images an ID mark at a specified position on substrate S using mark camera 54 to acquire the substrate ID (S105). Continuing, CPU 61 acquires mounting position information for mounting components on substrate S based on received command signals (S110), and then performs component pickup processing of picking up components by using suction nozzle 52 to suction-pickup a component (die D).

Figure 6:
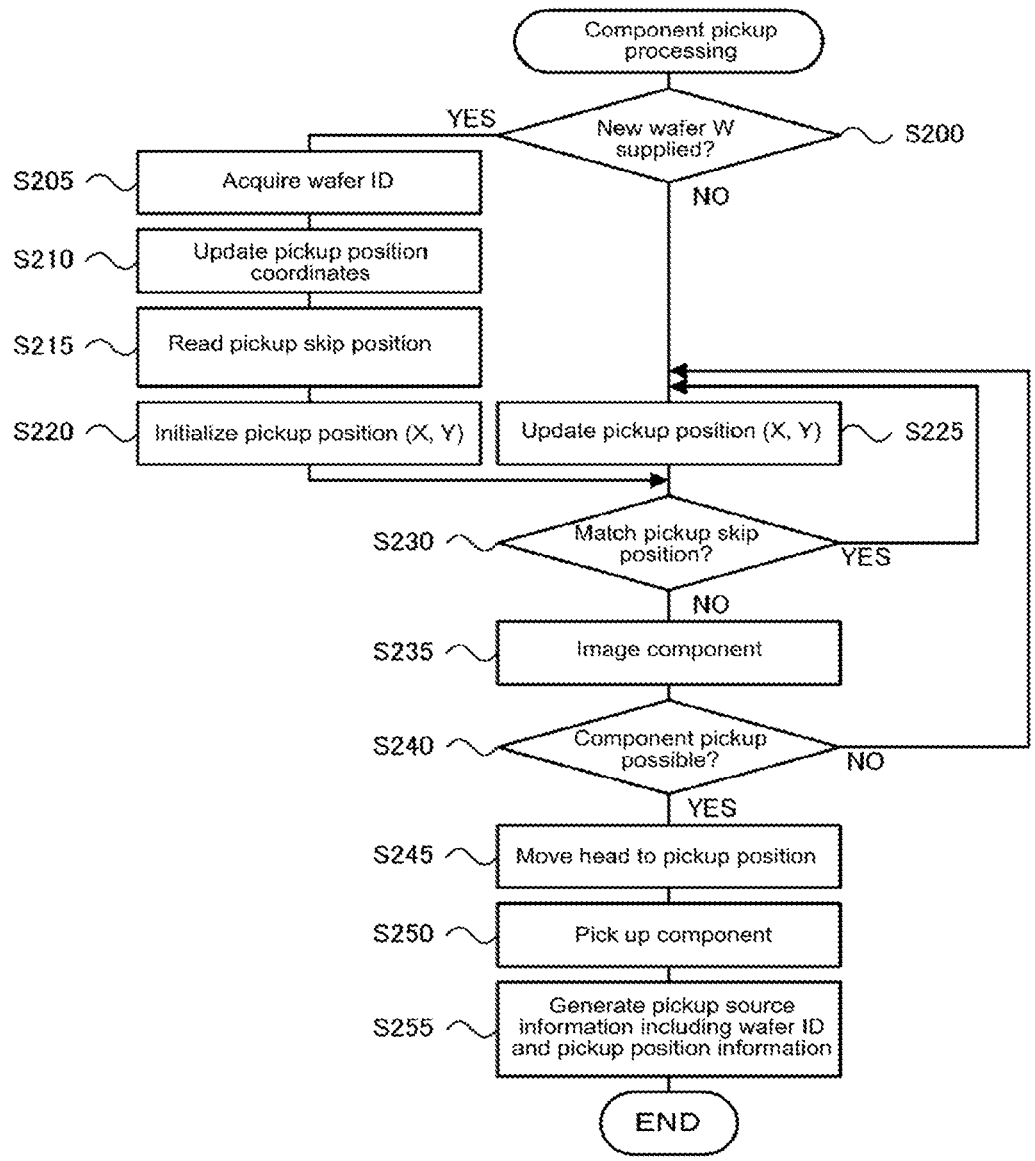
FIG. 6 is a flowchart showing an example of component pickup processing.

FIG. 6 is a flowchart showing an example of component pickup processing performed by CPU 61 of mounting control device 60. With component pickup processing, CPU 61, first, determines whether a new wafer W has been supplied from component supply device 12 (S200). When CPU 61 determines that a new wafer W has been supplied, CPU 61 images ID mark 19 at a specified position on wafer pallet 13 using mark camera 54 to acquire the wafer ID (S205). Then, CPU 61 reads pickup position coordinates corresponding to the wafer type based on the acquired wafer ID from HDD 63 and updates the coordinates for picking up dies D (S210), then reads pickup skip information from HDD 63 and sets skip positions (S215), and then sets pickup position coordinates (X, Y) to an initial value (S220). Here, pickup skip information is information sent from management device 90 that links the type of wafer W and pickup skip position information. CPU 61 of mounting control device 60, upon receiving pickup skip information from management device 90, memorizes the pickup skip information on HDD 63, which is read in S215 as the pickup skip position information of skip information that corresponds to the wafer type. Note that, CPU 61 skips S215 if there is no pickup skip information corresponding to the wafer type memorized on HDD 63. Also, CPU 61, in S220, from coordinates on wafer W from which pickup of a die D is possible, sets the pickup position coordinates furthest to the top and left as the initial value.

On the other hand, CPU 61, upon determining that instead of a new wafer W a wafer W from which dies D have already been picked up has been supplied in S200, updates the pickup position coordinates to the next pickup position (S225). In S225, CPU 61, if the pickup position coordinates of an adjacent position at an increment of one in the X direction are valid with respect to the pickup position coordinates of the previous die D, updates the pickup position to that position, and if the pickup position coordinates of the adjacent position are not valid, updates the pickup position to a position at an increment of one in the Y direction and with a component furthest to the left in the X direction for which pickup is possible.

Continuing, CPU 61 determines whether the pickup position coordinates set in S220 or S225 match a pickup skip position read in S215 (S230), and if determining that there is a match, repeats updating of the pickup position coordinates (X, Y) as in S225 until it is determined that there is no match with the pickup skip information. By this, CPU 61 is able to perform operation such that suction nozzles 52 do not pick up a die D from a pickup skip position as specified in the pickup skip information sent from management device 90 (and memorized in HDD 63). Thus, it is possible to prevent dies D from pickup skip positions being mounted on substrate S.

Next, CPU 61 images a specified range that includes the present pickup position using mark camera 54 (S235), processes the captured image, and determines whether pickup of the die D is possible (S240). If CPU 61 determines that pickup of die D is not possible due to die D being missing or die D being defective (cracked or chipped), processing returns to S225 and the pickup position coordinates (X, Y) are updated. On the other hand, CPU 61, upon determining that pickup of die D is possible, controls moving mechanism 40 to move head 50 such that suction nozzle 52 is above the pickup position (S245), and controls head 50 to pick up the die D at the pickup position coordinates (X, Y) by using suction nozzle 52 to suction-pickup the die D (S250). Then, CPU 61 generates pickup source information that includes the wafer ID acquired in S205, the pickup position coordinates (X, Y) of the die picked up this time, that is, the updated pickup information coordinates (X, Y) that were set (S255), and completes component pickup processing.

Returning to component mounting processing of FIG. 5, next, CPU 61 controls moving mechanism 40 to move head 50 above substrate S via a route above component camera 56 (S120). Also, CPU 61, when head 50 is above component camera 56, images die D held by suction nozzle 52 using component camera 56, processes the captured image to recognize the pickup state of die D (pickup component) (S125), and determines whether there is an error with the pickup component (S130). CPU 61, if determining that there is an error such as a problem with the orientation of die D or the pickup position being deviated with respect to the suction nozzle 52 an amount exceeding a tolerance range, controls moving mechanism 40 to move head 50 to a specified discarding position and discards die D (S135), then returns to S115, performs pickup of die D again and performs processing from S120.

On the other hand, CPU 61, if determining that there is no error with die D in S130, controls head 50 such that die D is mounted on substrate S using suction nozzle 52 (S140). Continuing, CPU 61 generates mounting destination information including a substrate ID acquired in S105, and current mounting position information (S145), and sends the pickup source information and mounting destination information to management device 90 (S150). Then, CPU 61 determines whether there are still unmounted dies D for substrate S (S155), and if there are unmounted dies D, returns to S115, picks up die D and performs processing from S120, and if there not unmounted dies D, unloads substrate S (S160), and ends component mounting processing.

Figure 7:
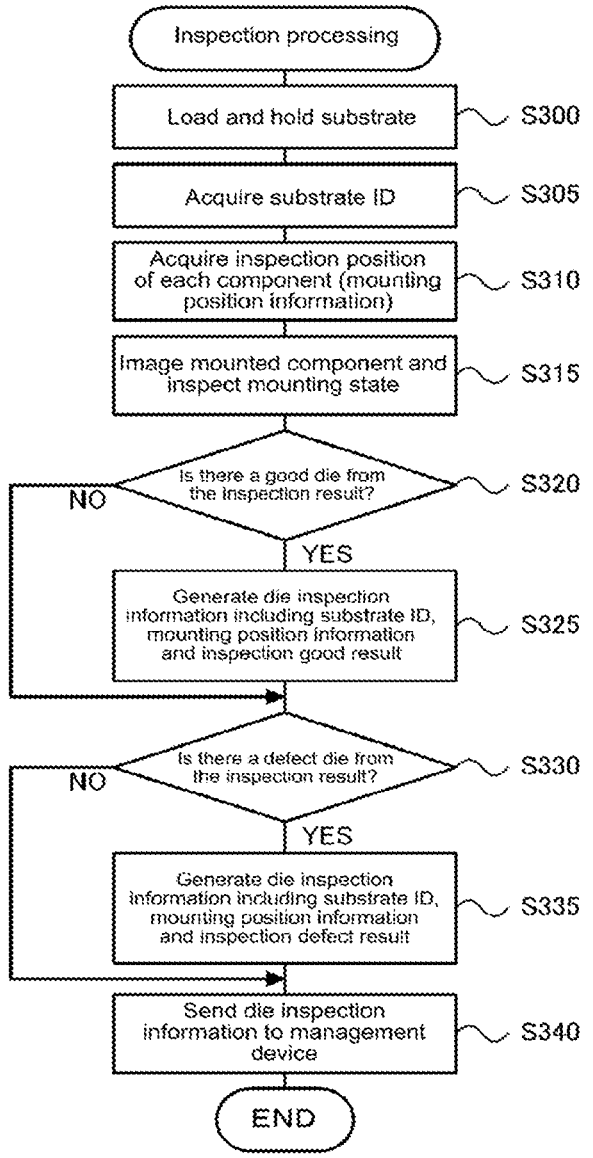
FIG. 7 is a flowchart showing an example of inspection processing.

Described next is inspection processing of inspection by inspection device 70 of the mounting state of components (dies D) mounted on substrate S. FIG. 7 is a flowchart showing an example of inspection processing performed by CPU 71 of inspection device 70. In this inspection processing, CPU 71, first, after controlling substrate conveyance device 72 such that substrate S is conveyed above substrate holding device 74, controls substrate holding device 74 to hold substrate S (S300). Next, CPU 71 images an ID mark on substrate S using inspection camera 78 and acquires the substrate ID (S305), then acquires inspection positions (mounting position information) of each component based on a command signal sent from management device 90 (S310).

Then, CPU 71, based on the acquired inspection positions, images components mounted on substrate S using inspection camera 78, processes the acquired images, and inspects the mounting state of the mounted components (S315). Continuing, CPU 71, based on the inspection results, determines whether there are dies D for which the inspection result was good (S320), and generates die inspection information including mounting position information of those dies D, the substrate ID acquired in S305, and the inspection good results (S325). Also, CPU 71, based on the inspection results, determines whether there are dies D for which the inspection result was defect (S330), and generates die inspection information including mounting position information of those dies D, the substrate ID acquired in S305, and the inspection defect results (S335). Then, CPU 71 sends the die inspection information generated in S325 and S335 to management device 90 (S340), and ends inspection processing.

Figure 8:
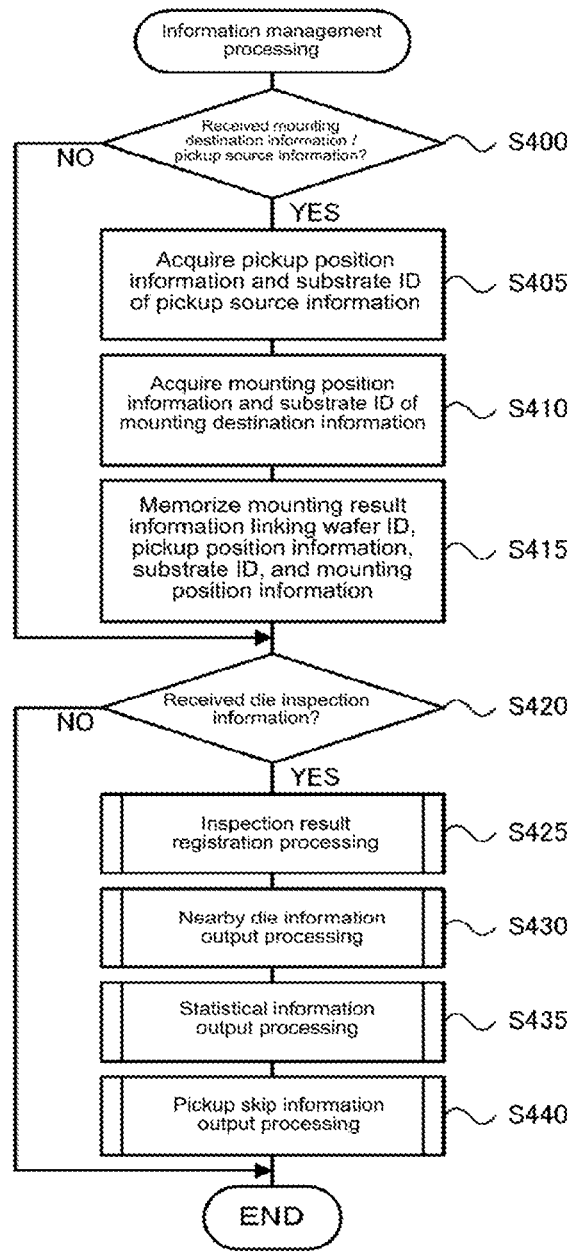
FIG. 8 is a flowchart showing an example of information management processing.

Continuing, described below is information management processing performed by management device 90. FIG. 8 is a flowchart showing an example of information management processing performed by CPU 91 of management device 90. In this information management processing, CPU 91, first, determines whether mounting destination information and pickup source information sent from mounting device 10 during the component mounting processing of FIG. 5 have been received (S400). If it is determined that the mounting destination information and the pickup source information have been received, the wafer ID and the pickup position information of the pickup source information are acquired (S405), the substrate ID and the mounting position information of the mounting destination information are acquired (S410), and mounting result information that links the wafer ID and pickup position information with the substrate ID and mounting position information is memorized on HDD 93 (S415), then processing proceeds to the next step. Also, CPU 91, if determining that the mounting destination information and the pickup source information have not been received, skips S405 to S415, and processing proceeds to the next step.

Figure 9:
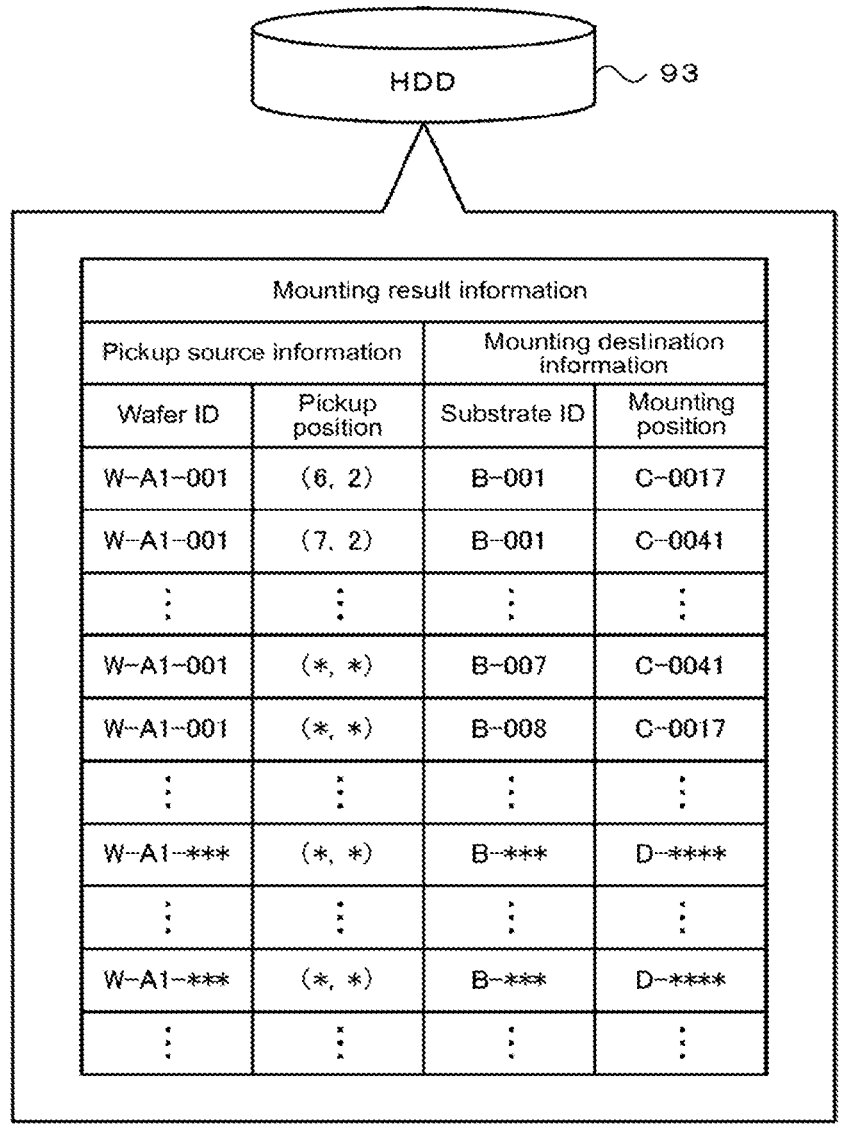
FIG. 9 illustrates an example of mounting result information memorized on HDD 93.

FIG. 9 illustrates an example of mounting result information memorized on HDD 93. As shown, the pickup positions of each die D picked up from wafer W with wafer ID "W-A1-001" and information of the mounting destination (substrate ID and mounting position information) are linked and memorized. Thus, if the substrate ID and mounting position information are known are mounting destination information of die D, it is possible to determine the pickup source information of the die D, that is, the position on which wafer W from which die D was picked up. Note that, "W-A1" of the wafer ID represents the type of wafer and a manufacturing number of "001". Also, "C-0017" and so on of the mounting position information represent circuit references or the like of substrate S, but in a similar manner to the pickup position, may represent XY coordinates with a specified position as a reference.

Next, CPU 91 determines whether die inspection information sent from inspection device 70 in the inspection processing of S340 of FIG. 7 has been received (S420). CPU 91, if determining that the die inspection information has been received, performs inspection mounting registration processing (S425), nearby die information output processing (S430), statistical information output processing (S435), and pickup skip information output processing (S440), and then ends information management processing. Also, CPU 91, if determining that the die inspection information has not been received, skips S425 to S440, and ends information processing management.

Figure 10:
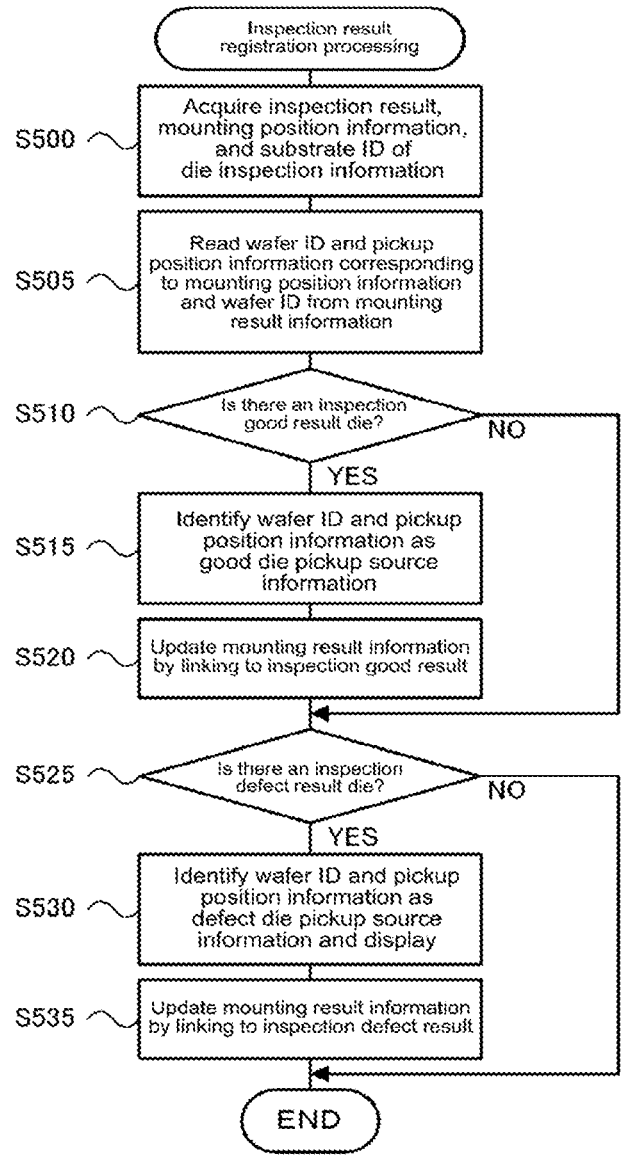
FIG. 10 is a flowchart showing an example of inspection result registration processing.
Figure 11:
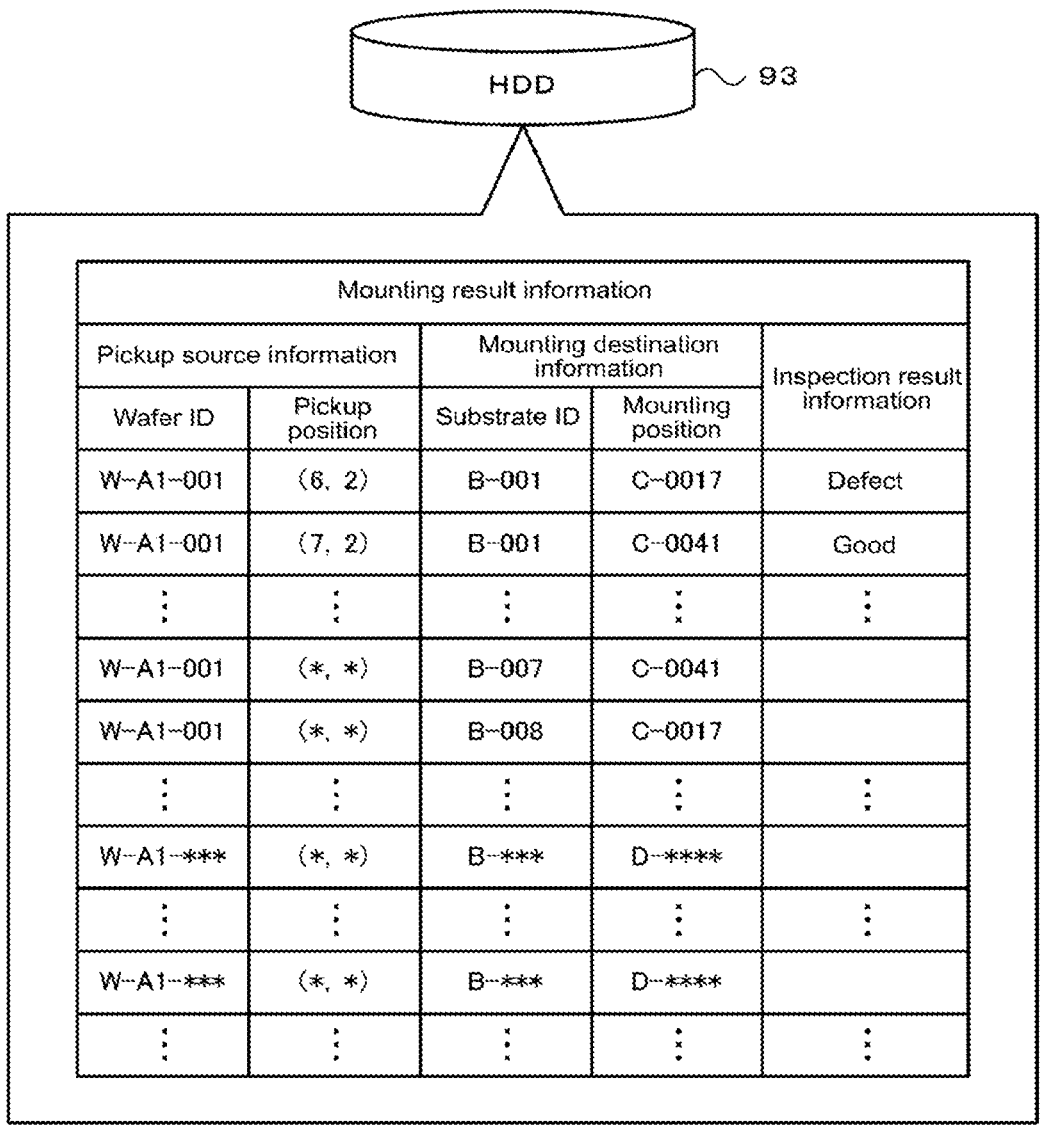
FIG. 11 illustrates an example of mounting result information to which is linked inspection result information.

Inspection result registration processing of S425 is processing for registering inspection results linked to mounting results, and is performed based on the flowchart of FIG. 10. FIG. 11 illustrates an example of mounting result information to which is linked inspection result information. With the inspection result registration processing of FIG. 10, CPU 91, first, acquires the substrate ID of the received die inspection information (S500), and reads the pickup source information (wafer ID and pickup position information) corresponding to the substrate ID and mounting position information by referencing the mounting result information memorized on HDD 93 (S505). Continuing, CPU 91 determines whether there are dies D for which the inspection result is good (S510), and if determining that there are dies S for which the inspection result is good, identifies the wafer ID and pickup position information corresponding to that die D as good die pickup source position information (S515), and updates the mounting result information by linking the inspection good result with the identified good die pickup position information (wafer ID and pickup position information) (S520). In the example of FIG. 11, if inspection good result die D is at mounting position "C-0041" of substrate ID "B-001", the pickup position (7, 2) of wafer ID "W-A1-001" is identified as good die pickup source position information and linked to an inspection result of "good". Note that, empty fields in the inspection result information of FIG. 11 represent that inspection has not been performed yet. Also, CPU 91, if determining that there are no dies with inspection good results in S510, skips S515 to S520, and processing proceeds to the next step.

Continuing, CPU 91 determines whether there are dies D for which the inspection result is a defect (S525), and if determining that there are dies S for which the inspection result is a defect, identifies the wafer ID and pickup position information corresponding to that die D as defect die pickup source position information and displays the information on display 98 (S530), updates the mounting result information by linking the inspection defect result with the identified defect die pickup position information (wafer ID and pickup position information) (S535), and ends inspection result registration processing. In the example of FIG. 11, if inspection good result die D is at mounting position "C-0017" of substrate ID "B-001", the pickup position (6, 2) of wafer ID "W-A1-001" is identified as defect die pickup source position information and linked to an inspection result of "defect". Note that, in S530, CPU 91 displays defect die pickup source position information on display 98, but may simply identify the defect die pickup source position information and keep it, displaying it based on a request from an operator. Also, CPU 91, if determining that there are no dies with an inspection defect result in S525, skips S530 and S535 and ends inspection result registration processing.

Figure 12:
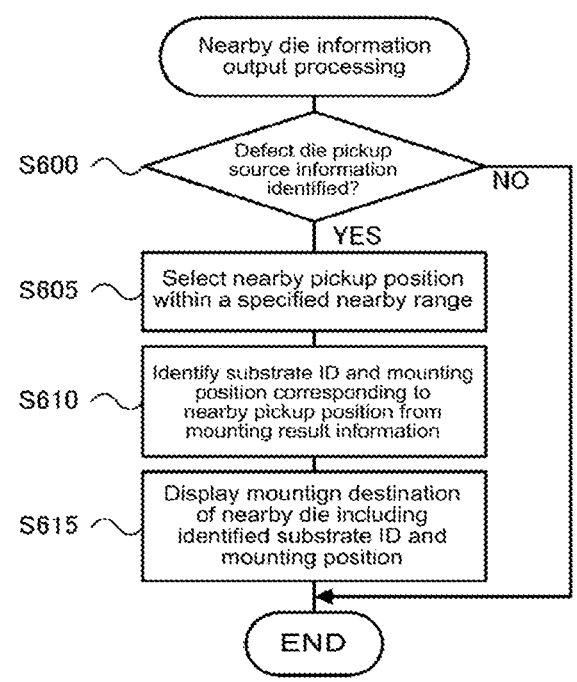
FIG. 12 is a flowchart showing an example of nearby die information output processing.
Figure 13:
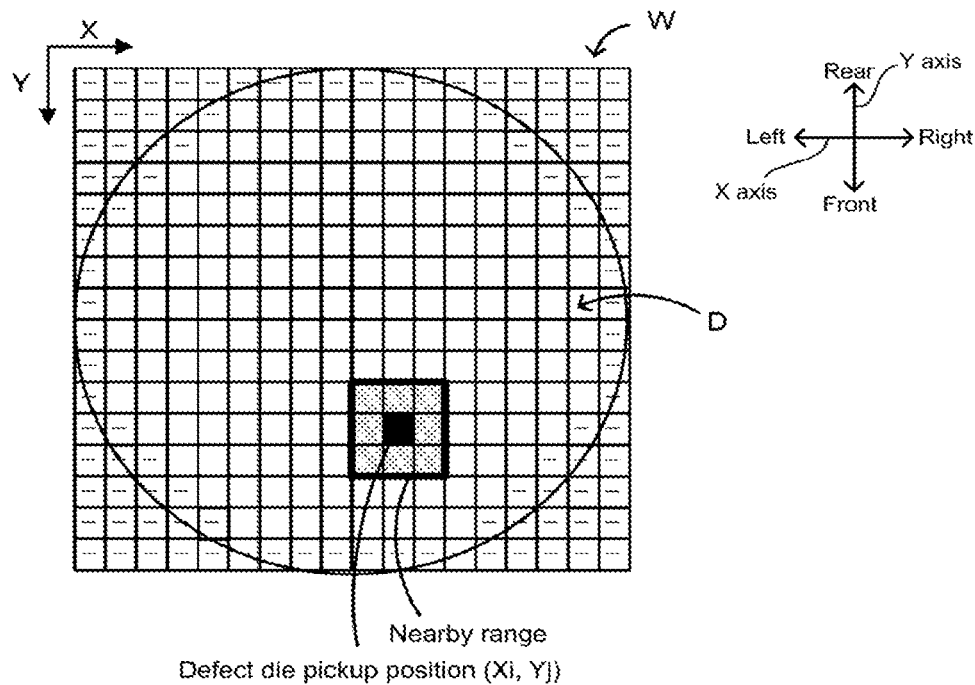
FIG. 13 illustrates an example of a state of selecting nearby pickup positions and nearby die information.

Nearby die information output processing of S430 is processing for outputting information of nearby dies picked up from nearby to a die D for which the inspection result was a defect, and is performed based on the flowchart of FIG. 12. FIG. 13 illustrates an example of a state of selecting nearby pickup positions and nearby die information. With the nearby die information output processing of FIG. 12, CPU 91, first, determines whether defect die pickup source information as identified in inspection result registration processing of FIG. 10 (S600), and if determining that defect die pickup source information has not been identified, ends nearby die information output processing. On the other hand, CPU 91, if determining that defect die pickup source information has been identified, selects a nearby pickup position within a specified nearby range with respect to the pickup position identified as the defect die pickup source information (S605). As shown in FIG. 13(a), the nearby range, for example, may be a range that includes eight pickup positions that surround a pickup position (Xi, Yj) identified as defect die pickup source information.

CPU 91, upon selecting the nearby pickup positions, identifies the substrate ID and mounting position information corresponding to the nearby pickup positions by referencing the mounting result information (S610), displays the identified substrate ID and mounting position information as mounting destination information of the nearby dies on display 98 (S615), and ends nearby die information output processing. For example, as shown in FIG. 13(b), CPU 91 displays the pickup position information (Xi, Yj) and the mounting destination information of the defect die along with the pickup position information and the mounting destination information (substrate ID and mounting position information) of nearby dies in a table.

Here, defects in dies D such as cracks may arise due to die D causes such as the influence of warpage of the thickness of the dies D during dicing, or due to equipment causes such as pushing defects of suction nozzle 52 or raising defects of a pusher pin during pickup (suction pickup) or mounting of dies D by mounting device 10. The thickness and warpage of dies D for which a defect occurred and nearby dies D are similar, and these dies are diced at the same time. Therefore, for defects with a die D cause, the possibility of the same occurring with a nearby die D is high. Also, there are cases in which push defects of a suction nozzle 52 or raising defects of a pusher pin occur at a specific region rather than over the entire die. Therefore, for defects caused by equipment too, the possibility of the same occurring with a nearby die D is high. Thus, defects occurring for dies D are likely to occur for nearby dies D too. Also, these defects there is a possibility that these defects will not be noticed during S125 or S130 of component mounting processing of FIG. 5. Therefore, by outputting the mounting destination information of nearby dies, it is possible to track whether defects occur in a similar manner for nearby dies, allowing for improved quality and prevention of the release of defective products.

Figure 14:
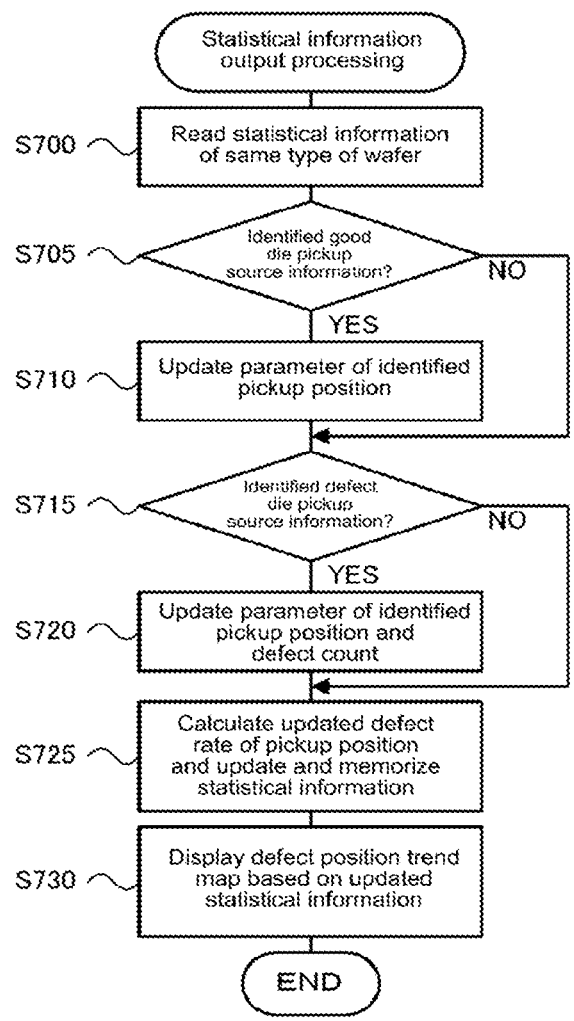
FIG. 14 is a flowchart showing an example of statistical information output processing.

Statistical information output processing of S435 is processing for outputting statistical information of the defect rates of inspection results, and is performed based on the flowchart of FIG. 14. With this statistical information output processing CPU 91, first, reads statistical information about the same type of wafer W from HDD 93 (S700), and determines whether good die pickup source information has been identified in the inspection result registration processing of FIG. 10 (S705). CPU 91, if determining that good die pickup source information has been identified, performs updating by incrementing by one the parameter of the statistical information regarding the pickup position identified as good die pickup source information (S710), then processing proceeds to the next step. Also, CPU 91, if determining that good die pickup source information has not been identified, skips S710 and processing proceeds to the next step.

Next, CPU 91 determines whether defect die pickup source information has been identified in inspection result registration processing (S715), and if detect die pickup source information has been identified, performs updating by incrementing by one respectively the defect count and the parameter of the statistical information regarding the pickup position identified as defect die pickup source information (S720), then processing proceeds to the next step. Also, CPU 91, if determining that defect die pickup source information has not been identified, skips 5720 and processing proceeds to the next step. Continuing, CPU 91 updates the statistical information by re-calculating the defect rate of the pickup positions for which the parameter and the defect count were updated and memorizes the result in HDD) 93 (S725), displays a defect position trend map based on the statistical information on display 98 (S730), and ends statistical information output processing.

Figure 15:
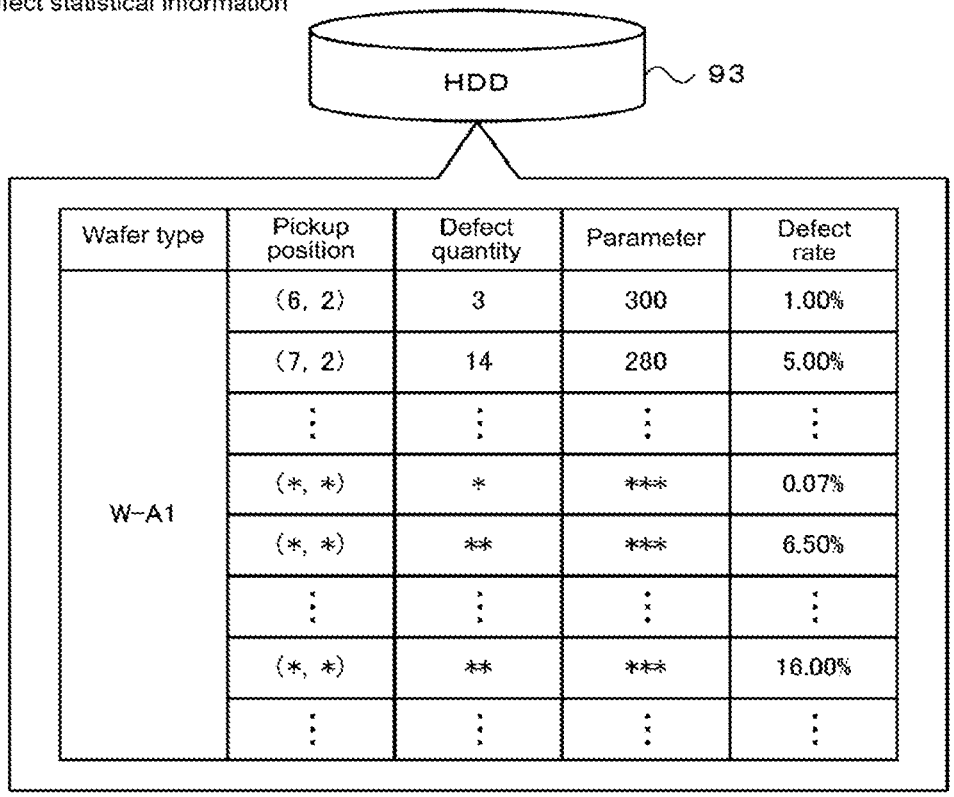
FIG. 15 illustrates an example of defect statistical information and a defect position trend map.
Figure 15:
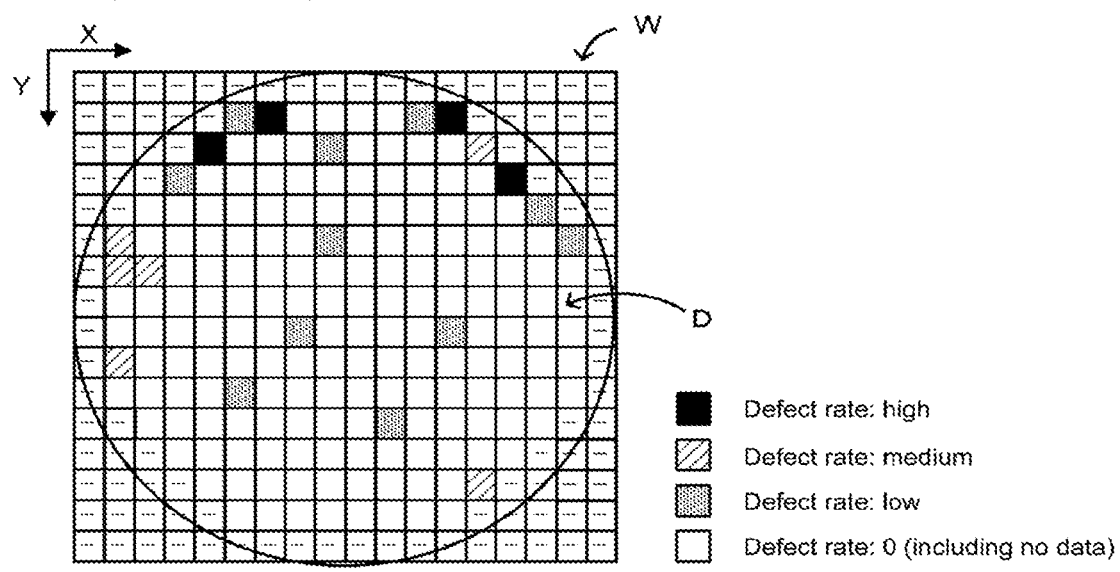

FIG. 15 illustrates an example of defect statistical information and a defect position trend map. In the defect statistical information of FIG. 15(a), the defect rate of dies D at each pickup position of wafers W the same as type "W-A1" are tallied. For example, for dies D picked up from pickup position (6, 2), the defect count is three with respect to a parameter of 300, giving a defect rate of 1.00%. Also, for dies D picked up from pickup position (7, 2), the defect count is 14 with respect to a parameter of 280, giving a defect rate of 5.00%. This statistical information is consecutively updated as the inspection results increase. Also, as shown in FIG. 15(b), the defect position trend map shows pickup positions of dies D and the defect rate for that position. In the example of FIG. 15(b), by showing the defect rate as four levels—high, medium, low, zero (including no data)—it is easy to see the trends in defect rates and for which dies D picked up from which pickup positions (pickup ranges) the defect rate is high.

Figure 16:
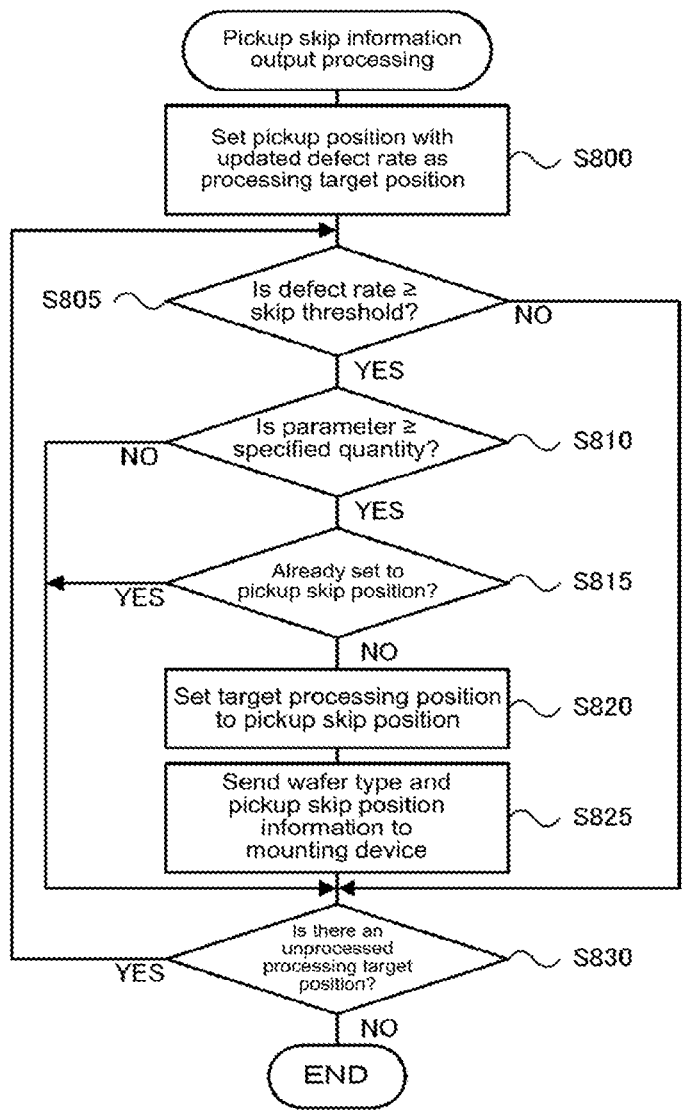
FIG. 16 is a flowchart showing an example of pickup skip information output processing.

Pickup skip information output processing of S440 is processing for outputting instructions to mounting device 10 to skip pickup of components (dies D) from pickup positions with a high defect rate based on the statistical information, and is performed based on the flowchart of FIG. 16. In this pickup skip information output processing, CPU 91, first, sets a pickup position for which the defect rate was calculated in S725 of statistical information output processing of FIG. 14 as the processing target position (S800), and determines whether the defect rate of the processing target position is equal to or greater than a specified skip threshold (S805). The skip threshold, for example, may be a defect rate corresponding to the difference between a "high" and a "medium" defect rate on the defect position trend map of FIG. 15(b). Thus, it is possible to prevent pickup of components (dies D) from a pickup position with a "high" defect rate. CPU 91, if determining that the defect rate of the processing target position is equal to or greater than the specified skip threshold, determines whether the parameter of the processing target position is equal to or greater than a specified quantity (S810), and determines whether the processing target position has been set as a pickup skip position (S815). CPU 91, if determining that the parameter of the processing target position is equal to or greater than the specified skip threshold and that the processing target position has not been set as a pickup skip position, sets the processing target position as a pickup skip position (S820), sends the wafer type and pickup skip position information to mounting device 10 (S825), then processing proceeds to the next step. As above, mounting device 10 registers pickup skip information including the wafer type and pickup skip position information on HDD 93, and in a case in which a wafer W of the same type is supplied, performs processing such that a die D is not picked up from the pickup skip position read in S215 of component pickup processing of FIG. 6. Therefore, because management device 90 issues instructions such that a die D is not picked up from a pickup position with a high trend defect rate, it is possible to reduce the quantity of mounting errors.

On the other hand, CPU 91, if determining that the parameter of the processing target position is less than the specified quantity, determines that the processing target position is already set as a pickup skip position, skips S820 and S825, then processing proceeds to the next step. Here, in a case in which the parameter is less than the specified quantity (for example, from a few to a few dozen), the defect rate becomes high even if only one defect happens to be discovered. Thus, the defect rate would easily by equal to or greater than the skip threshold, and it may not be possible to perform pickup skips for which the defect position trend has been accurately reflected. Thus, if the parameter is less than the specified value, CPU 91 does not set the pickup skip position even if the defect rate is equal to or greater than the skip threshold. By this, it is possible to more accurately reflect trends (statistical information) of defect positions and it is possible to skip pickup of dies D from pickup positions for which defects occur easily. Also, CPU 91, if determining that the defect rate of the processing target position is not equal to or greater than the skip threshold in S805, skips S810 to S825, then processing proceeds to the next step. CPU 91 repeats this processing until it is determined that there are no processing target positions for which determination has not been performed (S830), then ends pickup skip information output processing.

Correspondences between constituent elements of the present embodiment and constituent elements of the disclosure will be clarified here. Management device 90 of the present embodiment corresponds to the information management device, CPU 91 that performs processing of S405 of the information management processing of FIG. 8 corresponds to the pickup source information acquiring means, CPU 91 that performs processing of S410 of the information management processing corresponds to the mounting destination information acquiring means, and CPU 91 that performs processing of S415 of the information management processing and HDD 93 that memorizes the mounting result information of FIG. 9 correspond to the memorizing means. CPU 91 that performs processing of S500 of the inspection result registration processing of FIG. 10 (when the inspection result is a defect) corresponds to the defect result information acquiring means, and CPU 91 that performs processing of S530 and S535 of the inspection result registration processing corresponds to the pickup source information identifying means. CPU 91 that performs the nearby information output processing of FIG. 12 and display 98 that displays the nearby die information of FIG. 13(*b*) correspond to the nearby component information outputting means. CPU 91 that performs the statistical information output processing of FIG. 14 and display 98 that displays the defect position trend map of FIG. 15(*b*) correspond to the statistical information outputting means. CPU 91 that performs the pickup skip information output processing of FIG. 16 corresponds to the instruction information outputting means. Note that, an example of an information management method of the present disclosure is obvious from the descriptions of operation of management device 90 of the present embodiment.

Management device 90 of the present embodiment described above, when a component (die D) is mounted on substrate S, acquires pickup source information that includes pickup position information of the mounted component and mounting destination information that includes mounting position information of the mounted component and memorizes mounting result information that links both the above information on HDD 93, and by referencing the mounting result information to check the pickup source information from the mounting destination information of the mounted component, is able to identify the pickup position at the wafer W from which the mounted component was picked up. Thus, for example, in a case in which a defect occurs with the mounted component, it is possible to use the mounting result information to investigate whether there is a relationship between the occurrence of the defect and the pickup position of the component.

Also, management device 90, in a case in which a wafer ID for identifying wafer W is included in the pickup source information, a substrate ID for identifying the substrate S is included in the mounting destination information, and an inspection result of a substrate S mounted with components (dies D) is a defect, acquires inspection information including the substrate ID of the substrate S on which a component with a defect was mounted and the mounting position information of the component with the defect, then references the mounting position information of HDD 93 to identify the pickup position information of the defect component at the pickup source wafer W. Thus, because it is possible to identify a pickup source wafer W from which a defect component was picked up and pickup position information of the defect component at the pickup source wafer W, it is possible to obtain useful information for analysis of defect causes from the mounting result information.

Also, management device 90, based on the wafer ID of the pickup source wafer W and the pickup position information of the defect component, and referring to the mounting result information, selects a nearby pickup position of a specified range nearby to the pickup position of the defect component at the pickup source wafer W, identifies the substrate ID of the substrate S on which the nearby component (nearby die) picked up from the nearby pickup positions were mounted, and the mounting position information of the nearby component on the substrate, and outputs these to display 98 as nearby component information. Thus, because it is possible to identify a mounting position and a substrate S on which nearby components were mounted, it is possible to perform a follow-up investigation of the mounting position of nearby components.

Also, management device 90, based on the wafer ID of the pickup source wafer W and the pickup position information of the defect component, creates and outputs to display 98 statistical information relating to the occurrence of the defect component for each pickup position of each component, for a same type of wafer from which the same type of component is picked up. Thus, it is possible to understand trends in pickup positions of components for which defects occur, and to investigate defect causes and perform countermeasures.

Also, management device 90, based on the statistical information, identifies pickup positions with a high occurrence rate of the defect components from among the pickup positions of components on the same type of wafer, and outputs pickup skip information (instruction information) to a mounting device so as to not pick up the component from the identified pickup positions. Thus, in a case in which a given trend can be seen in pickup positions of defect components, because it is possible to pick up components while missing out those pickup positions, the occurrence of defect substrates on which defect components are mounted can be curtailed.

Meanwhile, it goes without saying that the disclosure is not limited to the above-mentioned embodiment and various embodiments may be applied within the technical scope of the disclosure.

For example, in an embodiment above, mounting destination information of nearby dies is identified and output for nearby dies picked up from a nearby range to defect die D, but the configuration is not limited to this. For example, CPU 91 may determine whether mounting of nearby dies is complete, and if mounting is complete, may identify and output the mounting destination information of the nearby dies, and if mounting is not complete, may stop mounting of nearby dies. That is, the configuration is not limited to setting pickup positions for which the defect rate of the statistical information is equal to or greater than a specified skip threshold as skip positions, the configuration may be such that when a defect die D is detected, pickup of dies D from around that area may be skipped immediately. In this case, CPU 91 may set pickup positions of a nearby range to the defect die D as pickup skip positions, and send those positions to mounting device 10. Also, to allow the stopping of mounting of nearby dies in a case in which a defect die D occurs, the configuration is not limited to that of the embodiment in which adjacent dies D are picked up consecutively, pickup may be performed by leaving a gap of a specified quantity between dies D.

In an embodiment above, die inspection information sent from inspection device 70 is used as an inspection result of die D for outputting nearby die information, but the configuration is not limited to this. For example, post-product-shipping defect occurrence information after substrate S mounted with dies D has been shipped as a product may be used as an inspection result of dies D. Also, post-product-shipping defect occurrence information may be used in statistical information output processing and pickup skip information output processing.

In an embodiment above, a substrate ID is included in the mounting destination information in S145 of component mounting processing of FIG. 5, but the configuration is not limited to this, and only the mounting position information may be included in the mounting destination information, without including the substrate ID. Also, in S255 of the component pickup processing of FIG. 6, a wafer ID is included with the pickup source information, but the configuration is not limited to this, and only the pickup position information may be included in the pickup source information, without including the wafer ID. Even in this case, for example, in cases in which the corresponding wafer W and substrate S can be grasped such as when inspecting directly after mounting, it is possible to identify the pickup position from the mounting position.

In an embodiment above, in the information management processing of FIG. 8, after performing inspection result registration processing of S425, three items of processing are performed—nearby die information output processing, statistical information output processing, and pickup skip information output processing—but the configuration is not limited to this, and any one, two, or all of the above items of processing may be omitted. Note that, pickup skip information output processing is performed based on statistical information, so if statistical information output processing is not performed, neither will pickup skip information output processing. In this case, S215 and S230 of component pickup processing in FIG. 6 may be omitted.

INDUSTRIAL APPLICABILITY

The present disclosure may be applied to a filed of mounting components picked up from a wafer onto a substrate.

REFERENCE SIGNS LIST

1: mounting system; 10: mounting device; 12: component supply device; 13: wafer pallet; 14: pallet main body; 14*a*: circular hole; 16: grip ring; 18: adhesive sheet; 19: ID mark; 20, 72: substrate conveyance device; 30, 74: substrate holding device; 40, 76: moving mechanism; 50: head; 52: suction nozzle; 54: mark camera; 56: component camera; 60: mounting control device; 61, 81, 91: CPU; 62, 82, 92: ROM; 63, 83, 93: HDD; 64, 84, 94: RAM; 65, 85, 95: input-output interface; 66, 86, 96: bus; 70: inspection device; 78: inspection camera; 80: inspection control device; 90: management device; 97: input device; 98: display; D: die; S: substrate; W: wafer

The invention claimed is:

1. An information management device for managing information related to mounting at a mounting system for picking up a component from a wafer on which multiple components are diced and mounting the component on a substrate, the information management system comprising:
  a pickup source information acquiring means configured to acquire pickup source information including pickup position information related to a pickup position of the component at the wafer and identification information for identifying the wafer;
  a mounting destination information acquiring means configured to acquire mounting destination information including mounting position information related to a mounting position of the component on the substrate and identification for identifying the substrate;
  a memorizing means configured to, when the component is mounted on the substrate, memorize mounting result information that links the pickup source information of the mounted component and the mounting destination information of the mounted component;
  a defect result information acquiring means configured to acquire defect result information including, in a case in which an inspection result of the substrate on which the component was mounted is received and a defect result is determined indicating that a defect has occurred for the component mounted on the substrate, identification information of the defect substrate with the defect,
  a pickup source information identifying means configured to, based on the identification information of the defect substrate and the mounting position information of the defect component, and referring to the mounting result information, identify identification information of the pickup source wafer from which the component was picked up and pickup position information of the defect component at the pickup source wafer; and
  a nearby component information output means configured to, based on the identification information of the pickup source wafer and the pickup position information of the defect component, and referring to the mounting result information, select a nearby pickup position of a specified range nearby to the pickup position of the defect component at the pickup source wafer, identify the identification information of the substrate on which the nearby component picked up from the nearby pickup position were mounted, identify the mounting position information of the nearby component on the substrate, and output these as nearby component information.

2. The information management device according to claim 1, further including
  a statistical information output means configured to, based on the identification information of the pickup source wafer and the pickup position information of the defect component, create and output statistical information relating to the occurrence of the defect component for each pickup position of each component, for a same type of wafer from which the same type of component is picked up.

3. The information management device according to claim 2, further including
  an instruction information output means configured to, based on the statistical information, identify pickup positions with a high occurrence rate of the defect components from among the pickup positions of each component on the same type of wafer, and output instruction information instructing a mounting device of a mounting system to not pick up the component from the identified pickup positions.

4. An information management method for managing information related to mounting at a mounting system for picking up a component from a wafer on which multiple components are diced and mounting the component on a substrate, the information management method comprising:
  acquiring pickup source information including pickup position information related to a pickup position of the component at the wafer and identification information for identifying the wafer;
  acquiring mounting destination information including mounting position information related to a mounting position of the component on the substrate and identification for identifying the substrate;
  memorizing, when the component is mounted on the substrate, mounting result information that links the pickup source information of the mounted component and the mounting destination information of the mounted component;
  acquiring defect result information including, in a case in which an inspection result of the substrate on which the component was mounted is received and a defect result is determined indicating that a defect has occurred for the component mounted on the substrate, identification information of the defect substrate with the defect,
  a pickup source information identifying means configured to, based on the identification information of the defect substrate and the mounting position information of the defect component, and referring to the mounting result information, identifying identification information of the pickup source wafer from which the component was picked up and pickup position information of the defect component at the pickup source wafer; and based on the identification information of the pickup source wafer and the pickup position information of the defect component, and referring to the mounting result information, selecting a nearby pickup position of a specified range nearby to the pickup position of the defect component at the pickup source wafer, identifying the identification information of the substrate on which the nearby component picked up from the nearby pickup position were mounted, identifying the mounting position information of the nearby component on the substrate, and outputting these as nearby component information.

5. An information management device for managing information related to mounting at a mounting system for picking up a component from a wafer on which multiple components are diced and mounting the component on a substrate, the information management system comprising:

circuitry configured to acquire pickup source information including pickup position information related to a pickup position of the component at the wafer and identification information for identifying the water;

acquire mounting destination information including mounting position information related to a mounting position of the component on the substrate and identification for identifying the substrate;

when the component is mounted on the substrate, memorize mounting result information that links the pickup source information of the mounted component and the mounting destination information of the mounted component;

acquire defect result information including, in a case in which an inspection result of the substrate on which the component was mounted is received and a defect result is determined indicating that a detect has occurred for the component mounted on the substrate, identification information of the defect substrate with the defect, based on the identification information of the defect substrate and the mounting position information of the detect component, and referring to the mounting result information, identify identification information of the pickup source wafer from which the component was picked up and pickup position information of the defect component at the pickup source wafer; and based on the identification information of the pickup source wafer and the pickup position information of the defect component, and referring to the mounting result information, select a nearby pickup position of a specified range nearby to the pickup position of the defect component at the pickup source wafer, identify the identification information of the substrate on which the nearby component picked up from the nearby pickup position were mounted, identify the mounting position information of the nearby component on the substrate, and output these as nearby component information.

6. The information management device according to claim 5, wherein the circuitry is further configured to, based on the identification information of the pickup source wafer and the pickup position information of the defect component, create and output statistical information relating to the occurrence of the defect component for each pickup position of each component, for a same type of water from which the same type of component is picked up.

7. The information management device according to claim 6, wherein the circuitry is further configured to, based on the statistical information, identify pickup positions with a high occurrence rate of the defect components from among the pickup positions of each component on the same type of wafer, and output instruction information instructing a mounting device of a mounting system to not pick up the component from the identified pickup positions.

* * * * *